(12) United States Patent
Hsieh

(10) Patent No.: US 6,564,986 B1
(45) Date of Patent: May 20, 2003

(54) METHOD AND ASSEMBLY FOR TESTING SOLDER JOINT FRACTURES BETWEEN INTEGRATED CIRCUIT PACKAGE AND PRINTED CIRCUIT BOARD

(75) Inventor: Steven H. C. Hsieh, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/802,772

(22) Filed: Mar. 8, 2001

(51) Int. Cl.[7] .......................... B23K 37/12; H05K 1/16; G01R 31/00; G01R 31/08
(52) U.S. Cl. ...................... 228/103; 228/102; 228/104; 438/106; 438/108; 174/260; 324/73.1; 324/500; 324/512; 324/522; 324/527
(58) Field of Search ................................ 228/102–104, 228/180.1, 180.22, 180.5; 438/106, 108; 174/255, 257, 260–6, 262; 257/700, 777, 786; 324/73.1, 500, 512, 522, 527, 528, 537

(56) References Cited

U.S. PATENT DOCUMENTS

| | | | | |
|---|---|---|---|---|
| 3,735,255 A | * | 5/1973 | Goldman | 324/73.1 |
| 4,684,884 A | * | 8/1987 | Soderlund | 156/89.12 |
| 5,059,897 A | * | 10/1991 | Aton et al. | 324/512 |
| 5,248,967 A | * | 9/1993 | Daneshfar | 340/931 |
| 5,347,086 A | * | 9/1994 | Potter et al. | 174/260 |
| 5,508,228 A | * | 4/1996 | Nolan et al. | 324/538 |
| 5,998,861 A | * | 12/1999 | Hiruta | 257/700 |
| 6,040,530 A | * | 3/2000 | Wharton et al. | 174/261 |
| 6,104,198 A | * | 8/2000 | Brooks | 324/538 |
| 6,187,418 B1 | * | 2/2001 | Fasano et al. | 174/257 |
| 6,208,156 B1 | * | 3/2001 | Hembree | 174/261 |
| 6,221,682 B1 | * | 4/2001 | Danziger et al. | 438/108 |
| 6,284,080 B1 | * | 9/2001 | Haq et al. | 156/89.12 |
| 6,320,201 B1 | * | 11/2001 | Corbett et al. | 257/202 |
| 6,326,555 B1 | * | 12/2001 | McCormack et al. | 174/255 |
| 6,448,506 B1 | * | 9/2002 | Glenn et al. | 174/260 |
| 6,452,502 B1 | * | 9/2002 | Dishongh et al. | 174/260 |
| 6,459,161 B1 | * | 10/2002 | Hirata et al. | 174/260 |
| 2002/0163355 A1 | * | 11/2002 | van Bavel et al. | 340/931 |
| 2002/0171133 A1 | * | 11/2002 | Mok et al. | 324/73.1 |

* cited by examiner

Primary Examiner—Tom Dunn
Assistant Examiner—L. Edmondson
(74) Attorney, Agent, or Firm—Patrick T. Bever; Edel M. Young

(57) ABSTRACT

A method and assembly for testing multiple IC packages for solder joint fractures that occur in response to thermal cycling. A test PCB is fabricated with contact pads arranged to match a BGA IC package footprint, wherein pairs of the contact pads are linked by conductive traces (lines) to form a lower portion of a daisy chain. The BGA IC package is modified to link associated pairs of solder balls, e.g., using wire bonding to form an upper portion of the daisy chain. Mounting the BGA IC package on the test PCB completes the daisy chain. By alternating between the test PCB contact pads that are linked by conductive traces and the solder balls that are linked by wire bonding, the daisy chain provides a conductive path that passes through all solder balls of the BGA IC package.

13 Claims, 6 Drawing Sheets

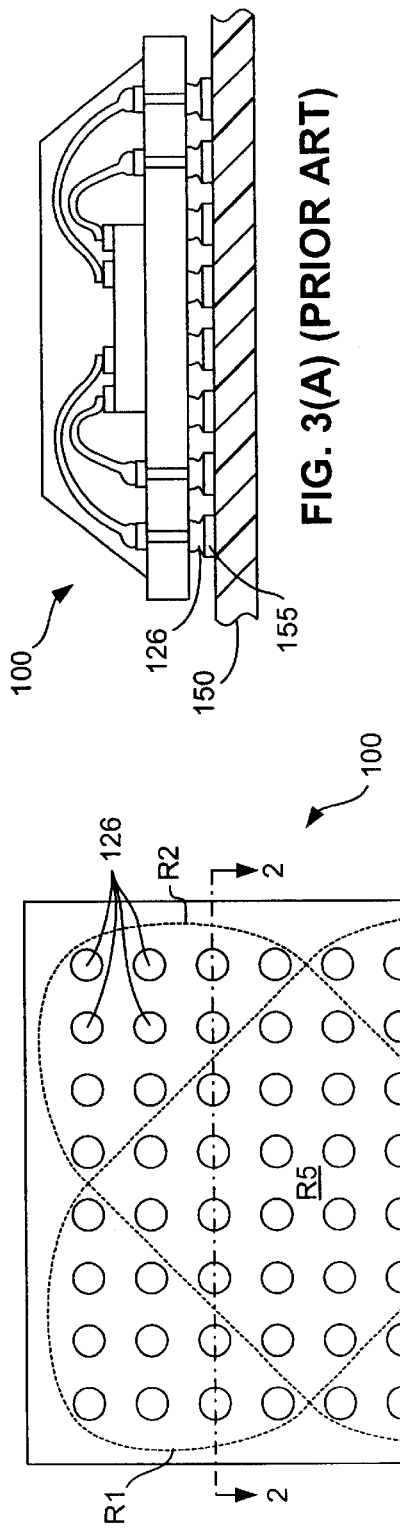
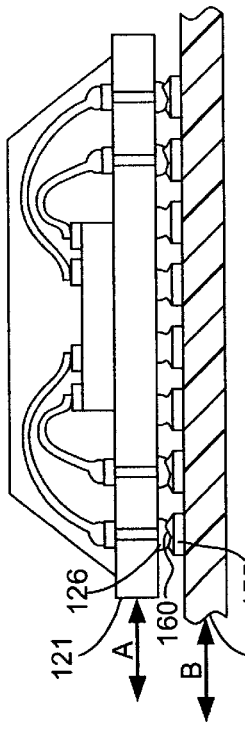
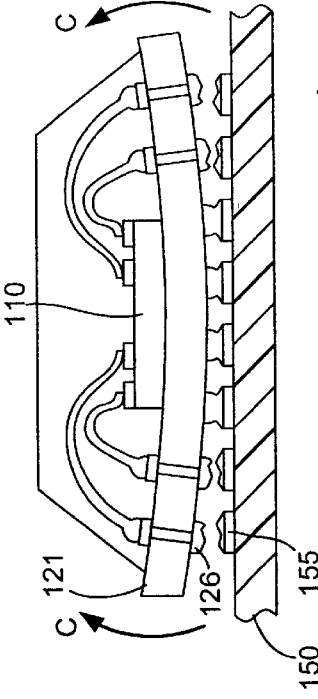
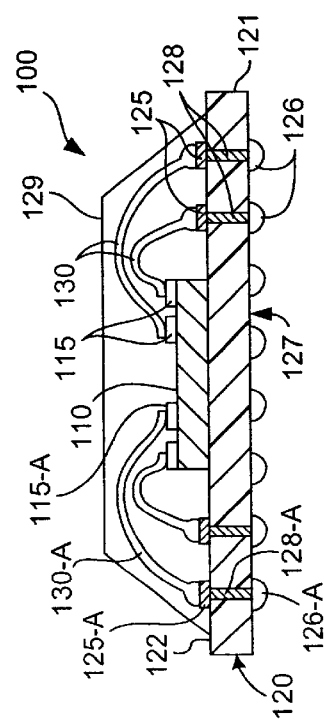
FIG. 1 (PRIOR ART)
FIG. 2 (PRIOR ART)
FIG. 3(A) (PRIOR ART)
FIG. 3(B) (PRIOR ART)
FIG. 3(C) (PRIOR ART)

METHOD AND ASSEMBLY FOR TESTING SOLDER JOINT FRACTURES BETWEEN INTEGRATED CIRCUIT PACKAGE AND PRINTED CIRCUIT BOARD

FIELD OF THE INVENTION

This invention relates to the field of integrated circuits (ICs), and more specifically to IC packages.

BACKGROUND OF THE INVENTION

Integrated circuit (IC) devices typically include an IC chip that is housed in a "package" that typically includes a plastic, ceramic or metal substrate. The IC chip includes an integrated circuit formed on a thin wafer of silicon. The IC package supports and protects the IC chip and provides electrical connections between the integrated circuit and an external circuit or system.

There are several IC package types, including ball grid arrays (BGAs), pin grid arrays (PGAs), plastic leaded chip carriers, and plastic quad flat packs. Each of the IC package types is typically available in numerous sizes. The IC package type selected by an IC manufacturer for a particular IC chip is typically determined by the size/complexity of the IC chip (i.e., the number of input/output terminals), and also in accordance with a customer's requirements.

FIGS. 1 and 2 show bottom and side sectional views of a typical BGA IC device 100 including an IC chip 110 mounted on an upper surface 122 of a BGA IC package 120. BGA IC package 120 includes a non-conductive (e.g., plastic or ceramic) package substrate 121 having an upper surface 122 on which is formed contact pads 125, sixty-four solder balls (sometimes referred to as solder bumps) 126 extending from a lower surface 127 of the substrate 121, and conductive vias 128 extending through package substrate 121 to electrically connect contact pads 125 and solder balls 126. The sixty-four solder balls 126 are arranged in a square "footprint" (pattern) simplify the following description—typical BGA IC packages include several hundred solder balls that are arranged in square or rectangular footprints. Bond wires 130 provide electrical connections between bonding pads 115 of IC chip 110 and conductive contact pads 125 formed on package substrate 120, thereby providing electrical signal paths between solder balls 126 and IC chip 110. For example, a signal applied to solder ball 126-A travels along via 128-A to contact pad 125-A, and from contact pad 125-A along bond wire 130-A to bonding pad 115-A of IC chip 110. An optional cover 129, such as a cap, mold compound, or "glob top", is placed or formed over IC chip 110 and bond wires 130 for protection.

IC manufacturers typically test their IC devices thoroughly before shipping to customers. Part of this IC testing determines if the IC device is functional, and the results of these tests provide customers operating characteristics that are used by the customers in designing their systems. Another portion of the testing process involves determining the reliability of the packaged IC device when subjected to various environmental conditions. Reliability testing can be divided into two levels. During first level reliability testing, packaged ICs are subjected to extreme temperatures, moisture, and mechanical stress (e.g., shock) to determine the maximum environmental conditions in which the packaged.IC device can reliably operate. During second level reliability testing, packaged ICs are subjected to various temperature, moisture, and mechanical stress (e.g., shock) cycles to determine the life expectancy between the IC device and a printed circuit board under such conditions. The statistical data generated during first and second level reliability testing is then provided to customers to help customers improve the reliability of their systems.

FIGS. 3(A) through 3(C) illustrate one part of second level reliability testing that involves testing for solder joint fractures between BGA IC device 100 and a printed circuit board (PCB) 150.

FIG. 3(A) shows BGA IC device 100 mounted on PCB 150 before thermal cycling. BGA IC device 100 is mounted on a PCB 150 using well-known methods such that solder balls 126 are partially melted to form a solder joint between solder balls 126 and conductive traces 155 provided on PCB 150.

FIG. 3(B) shows BGA IC device 100 and PCB 150 after thermal cycling is performed. It is well established that packaged IC devices and PCBs expand and contract at different rates in response to thermal cycling. FIG. 3(B) illustrates that an expansion rate A exhibited by packaged IC device 100 along a plane parallel to package substrate 121 is different from an expansion rate B exhibited by PCB 150, thereby generating stresses in the solder joints that can produce fractures 160. These fractures can significantly increase board-to-device resistances, and in some cases can produce open circuits between BGA IC device 100 and PCs 150. Second level reliability testing is utilized to determine when these fractures first occur (e.g., the minimum number of thermal cycles). This information is typically used by customers in the selection of a package type that is best suited for their particular system.

It is also established that packaged IC devices have a tendency to warp in response to thermal cycling. Referring to FIG. 1, package substrate 121 is divided into five regions R1 through R5, with region R5 being located in a center of package substrate 121. The tendency to warp is greatest in corner regions R1 through R4, and least in central region R5. As depicted in a simplified manner in FIG. 3(C), the warping force (indicated by curved arrows C) generates a torque that, when combined with the solder joint fracture problem described above, greatly increases the likelihood of disconnection between solder balls 126 and conductive traces 155.

As suggested above, second level reliability is statistical in nature, and data related to the number of thermal cycles needed to produce solder joint fractures is most accurate when a large number of samples are tested. However, such testing using conventional methods is highly time consuming and, when performed on a large number of BGA IC devices 100, can be very expensive. Therefore, what is needed is an efficient and low-cost method and assembly for determining when solder fracture occurs in a particular BGA package.

As also suggested above, warping of a BGA package can produce catastrophic system failures. What is also needed is an efficient method and assembly for identifying flaws or weaknesses in a BGA package design so that corrective measures can be taken to prevent the warping of a particular type of BGA package due to thermal cycling.

SUMMARY OF THE INVENTION

The present invention is directed to an efficient and low-cost method and assembly for detecting solder joint fractures that can be used to identifying flaws or weaknesses in a BGA package design.

In accordance with a first embodiment of the present invention, an assembly for analyzing solder joint fractures in response to thermal cycling includes an IC package mounted (i.e., soldered) to a test PCB. The IC package includes solder balls extending from a lower surface thereof that are arranged in a footprint (pattern) and are connected by conductive vias extending through the package body to contact pads formed on an upper surface thereof. Instead of being wire bonded to an IC chip, selected pairs of these contact pads are connected together to form a first daisy chain portion. The test PCB is provided with contact pads, which are arranged to match the IC package footprint. Similar to the IC package, associated pairs of the contact pads are connected by conductive lines to form a second daisy chain portion. The daisy chain is completed when the IC package is mounted on the test PCB and the solder balls are soldered to the contact pads. By alternating between the test PCB contact pads that are linked by conductive traces and the solder balls that are linked within the package, the daisy chain provides a conductive path between a first test pad and a final pad that passes through all solder balls of the IC package. During testing, a voltage is applied to the first test pad (i.e., a first end of the daisy chain) and current is measured at the final test pad (i.e., a second end of the daisy chain). The PCB and IC package are then subjected to thermal cycling and repeatedly tested until a solder joint fracture (i.e., an open circuit) is detected. By counting the number of thermal cycles required to produce the solder joint fracture, accurate expected lifetime data is generated for the IC package that can be used by a customer in the design of the customer's system.

In accordance with an aspect of the present invention, intermediate test pads are provided on the test PCB and connected to intermediate points of the daisy chain to facilitate identifying the region of the IC package footprint in which a solder joint fracture occurs during thermal cycling. The conductive path, which is formed by the daisy chained solder balls and contact pads, is routed through predetermined regions of the IC package footprint in a serial manner. For example, the conductive path segment travels through all solder balls located in one corner of a square IC package footprint before linking with a second segment passing through another region of the footprint. By providing an intermediate test pad at each end of the conductive path segments, each region of the footprint can be tested for electrical open circuits, thereby facilitating identification of the region in which solder joint fractures occur. Accordingly, package design defects to be quickly and efficiently corrected when test data indicates that a statistically large number of solder joint fractures occur in a particular footprint region.

In accordance with another aspect of the present invention, multiple test sites are provided on a test PCB, each test site including contact pads for mounting one IC package. Each test site is connected by elongated conductive traces to a test socket that can be received in a testing device. In particular, one terminal of the test socket is connected to a first contact pad of each test site, and is used to transmit a test voltage to each test site. A second contact pad of each test site is connected by a conductive tract to a corresponding second terminal of the test socket, thereby allowing simultaneous testing of several IC packages using a single test PCB.

In accordance with a second embodiment of the present invention, an assembly for analyzing solder joint fractures in response to thermal cycling includes a "flip-chip" IC package mounted (i.e., soldered) to a test PCB. The "flip-chip" IC package includes solder balls extending from a lower surface thereof that are arranged in a footprint (pattern) surrounding a central cavity formed on the lower surface, and are connected by conductive vias extending through the package body to contact pads located in the central cavity. A dummy IC (substrate) is mounted in the central cavity such that solder balls located on the dummy substrate are connected to the contact pads located in the central cavity. The dummy substrate is provided with metal lines connecting selected pairs of these solder balls, which in turn connect together selected pairs of contact pads to form a first daisy chain portion. As in the first embodiment, the test PCB is provided with contact pads, which are arranged to match the IC package footprint and to form a second daisy chain portion.

BRIEF DESCRIPTION OF THE DRAWINGS

These and other features, aspects and advantages of the present invention will become better understood with regard to the following description, appended claims, and accompanying drawings, where:

FIG. 1 is a bottom view showing a simplified BGA-packaged IC;

FIG. 2 is a cross-sectional side view showing the simplified BGA-packaged IC of FIG. 1 in additional detail;

FIGS. 3(A) through 3(C) are cross-sectional side views illustrating the creation of solder joint fractures;

DETAILED DESCRIPTION OF THE DRAWINGS

The present invention is directed to methods and assemblies for testing BGA packages for solder joint fractures. To simplify their description, aspects of the present invention are described below with reference to a BGA IC package 120A, which is essentially identical to BGA IC package 120 utilized in IC device 100 (shown in FIG. 2 and described above), but does not include connections to an IC chip. Although the following description is directed to BGA package 120A, which includes an eight-by-eight (64 solder ball) square footprint, those skilled in the art will recognize that the aspects described below can be incorporated into BGA packages having any number of solder balls and any footprint shape.

Figure 4:
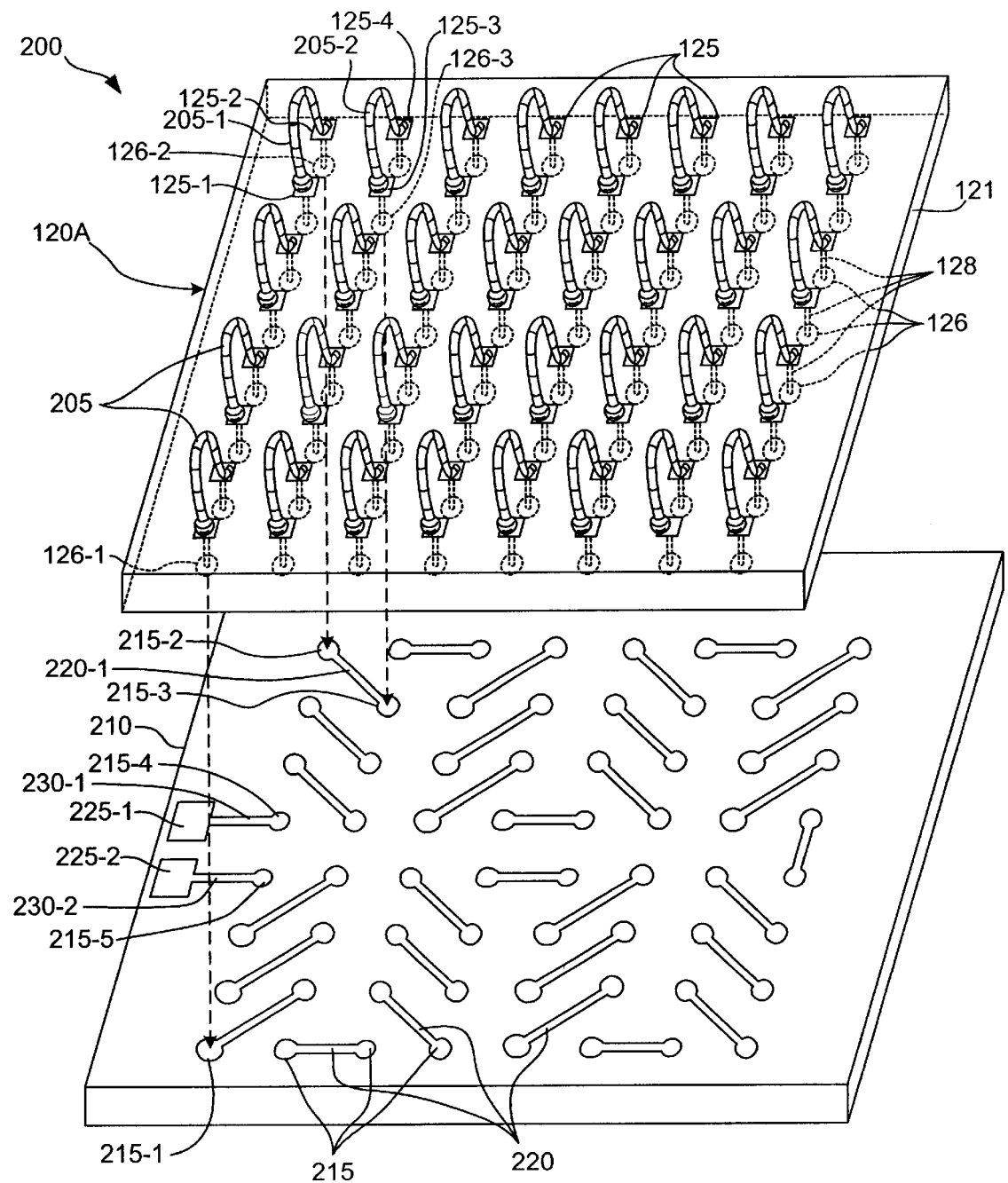
FIG. 4 is a perspective view showing an assembly for testing BGA packages in accordance with an embodiment of the present invention.

FIG. 4 is a perspective view showing an assembly 200 for testing BGA packages in accordance with a first embodiment of the present invention. Assembly 200 includes BGA package 120A that includes bond wires 205 (described below), and a test printed circuit board (PCB) 210.

Referring to the upper portion of FIG. 4, BGA package 120A includes package substrate 121, contact pads 125, solder balls 126, and conductive vias 128 that are arranged in the manner described above with reference to FIGS. 1 and 2. Note that contact pads 125 and conductive vias 128 are shown in a simplified arrangement (i.e., directly over their corresponding solder balls 126) for clarity. In actual BGA packages, the contact pads are arranged around a centrally located space provided for an IC chip (not shown), and conductive vias include horizontal portions located in package substrate 121 to provide the necessary connections between the solder balls and contact pads.

In accordance with an aspect of the present invention, instead of being wire bonded to an IC chip (not shown), selected pairs of contact pads 125 are electrically connected to form a first (upper) half of a daisy chain (referred to below as the first daisy chain portion). Note that each contact pad 125 is connected to only one associated contact pad 125 such that when BGA package 120 is mounted on test PCB 210, the first daisy chain portion formed on BGA package 120 combines with conductive traces formed on test PCB 210 to form a serial path (the "daisy chain") that passes through all sixty-four solder balls 126. In the first embodiment, the connections between associated pairs of contact pads 125 are provided by bond wires 205, which are formed using well-known wire bonding techniques. For example, contact pad 125-1 is connected to contact pad 125-2 by bonding wire 205-1, and contact pad 125-3 is connected to contact pad 125-4 by bonding wire 205-2. The use of wire bonding to provide the necessary contact pad connections provides a relatively low-cost platform for thermal cycle testing because the same BGA IC package used for testing is also utilized to produce IC devices (i.e., a separate production run is not required). Alternatively, the connections between contact pads 125 can be provided by custom producing BGA IC package 120 to include "hard wire" connections between associated metal vias 128, or to include metal lines formed directly on substrate 121 that connect associated contact pads 125, but these options introduce custom manufactured substrates that can increase production costs.

Referring to the lower portion of FIG. 4, test PCB 210 includes contact pads 215 that are arranged to match the footprint of IC package 120A, conductive (e.g., metal) lines 220, a first test pad 225-1 and a second test pad 225-2. Contact pads 215 are arranged to match the footprint of IC package 120A such that, when BGA package 120A is mounted on test PCB 210, each solder ball 126 (e.g., solder ball 126-1) contacts an associated contact pad 215 (e.g., contact pad 215-1, as indicated by the dashed arrow in FIG. 4). In accordance with another aspect of the present invention, associated pairs of contact pads 215 are connected by conductive lines 220, 230-1 and 230-2 to form a second (lower) half of the daisy chain (the second daisy chain portion) that extends between first test pad 225-1 and second test pad 225-2. Note that each contact pad 215 is connected to only one associated contact pad, and that the pattern of connections matches the first daisy chain portion formed on BGA package 120A to provide a conductive path between test pads 225-1 and 225-2 when BGA package 120A is mounted on test PCB 210. For example, contact pads 215-2 and 215-3 are connected by a conductive line 220-1. When BGA package 120A is mounted on test PCB 210, solder ball 126-2 is mounted on contact pad 215-2, and solder ball 126-3 is mounted on contact pad 215-3. Accordingly, a segment of the daisy chain is formed between contact pads 125-1 and contact pad 125-4 that passes along wire bond 205-1, conductive line 220-1, and wire bond 205-2. Note also that test pad 225-1 is connected to a first end of the daisy chain (i.e., contact pad 215-4) by conductive line 230-1, and test pad 225-2 is connected to a second end of the daisy chain (i.e., contact pad 215-5) by conductive line 230-2. Test pads 225-1 and 225-2 are utilized as described below to measure continuity passing through the daisy chain.

Figures 5, 6:
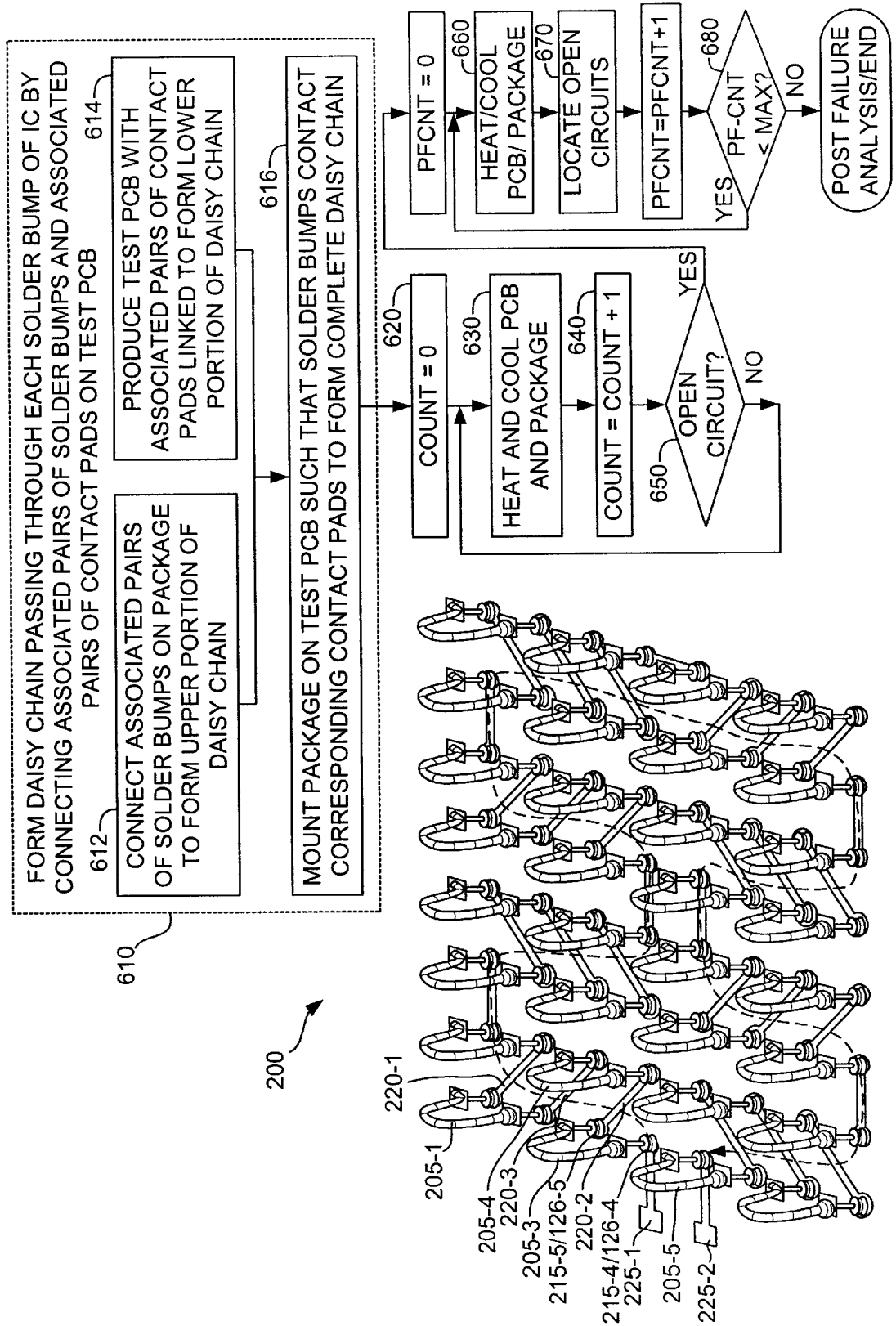
FIG. 5 is a simplified perspective view showing portions of the assembly shown in FIG. 4.
FIG. 6 is a flow diagram showing a method for performing thermal cycle testing in accordance with another embodiment of the present invention.

FIG. 5 is a perspective view showing assembly 200 after BGA package 120 is mounted on test PCB 210 (note that BGA substrate 121 and the substrate portion of test PCB 210 are removed for clarity). The dashed-line arrow generally indicates a current path defined by the daisy chain by which a current passes through assembly 200 between test pad 225-1 and test pad 225-2. That is, by alternating the connections between contact pads 215 on test PCB 210 and the connections between contact pads 125 on BGA package 120A, the resulting daisy chain forms a conductive between (first) test pad 225-1 and (final) test pad 225-2 that passes through all sixty-four solder balls 126. For example, when a voltage is applied to test pad 225-1 and test pad 225-2 is grounded, a current flows from test pad 225-1 to contact pad 215-4, from contact pad 215-4 to solder ball 126-4, from solder ball 126-4 to bond wire 205-3, and from bond wire 205-3 to solder ball 126-5/contact pad 215-5. This pattern is repeated as the current flows along conductive line 220-2 to bond wire 205-4 to conductive line 220-3 to bond wire 205-1 to conductor 220-1, etc., along the path indicated by the dashed-line arrow until it reaches bond wire 205-5 and is transmitted to test pad 225-2.

FIG. 6 is a flow diagram showing a method for testing IC package 120A for solder joint fractures in accordance with another aspect of the present invention. First, the daisy chain structure of assembly 200 (see FIGS. 4 and 5) is formed by connecting associated pairs of solder balls 126 of IC package 120A and associated pairs of contact pads 215 of test PCB 210 (step 610). This process is separated into three parts. Connection of associated pairs of solder balls 126 to form the first daisy chain portion (step 612) and production of test PCB 210 to form the second daisy chain portion (step 614) can be performed in any order. Once package 120A and test PCB 210 are completed, package 120A is mounted on test PCB 210 (step 616) using, for example, well-known reflow soldering techniques such that solder balls 126 are soldered to contact pads 215 to complete the daisy chain structure. Next, thermal cycle testing is initiated by setting a counter to zero (step 620), assembly 200 is heated and cooled according to predefined parameters (step 630), and the counter is incremented to register the number of completed thermal cycles (step 640). Solder joint fracture testing is then performed as described above (e.g., a voltage is applied at first test pad 225-1 and resistance is measured at final test pad 225-2) to determine if an initial open circuit has occurred (step 650). If no open circuit is detected, then thermal cycling is repeated and current measured until an open circuit occurs. When an initial open circuit is detected for a package, the location of the open circuit is noted, and an optional post-failure counter (PFCNT) is initiated. Thermal cycling is again performed (step 660) and the location of each additional open circuit (fracture) on the remaining other packages is identified using methods described below with reference to FIGS. 7 and 8 (step 670). The optional post-failure counter is then incremented, and steps 660 and 670 are repeated for a predetermined amount of time (e.g., 1,000 cycles). Upon completion, an optional post failure analysis is performed.

As discussed above, data regarding the number of thermal cycles at which a solder joint fracture occurs is typically provided to customers to facilitate system design. That is, when the customer's system is likely to be subjected to a large number of thermal cycles, the customer typically selects an IC package that is highly resistant to solder joint fracturing. Accordingly, the thermal cycle testing described above is often repeated multiple times for statistical purposes to determine an average number of thermal cycles at which solder joint fractures typically occur so that the customer is provided with useful and reliable data. Further, this data can also be utilized by the IC package manufacturer to identify package design flaws by identifying particular regions of the package footprint in which solder joint fractures occur most frequently. The following embodiments provide additional aspects of the present invention that facilitate these functions.

Figure 7:
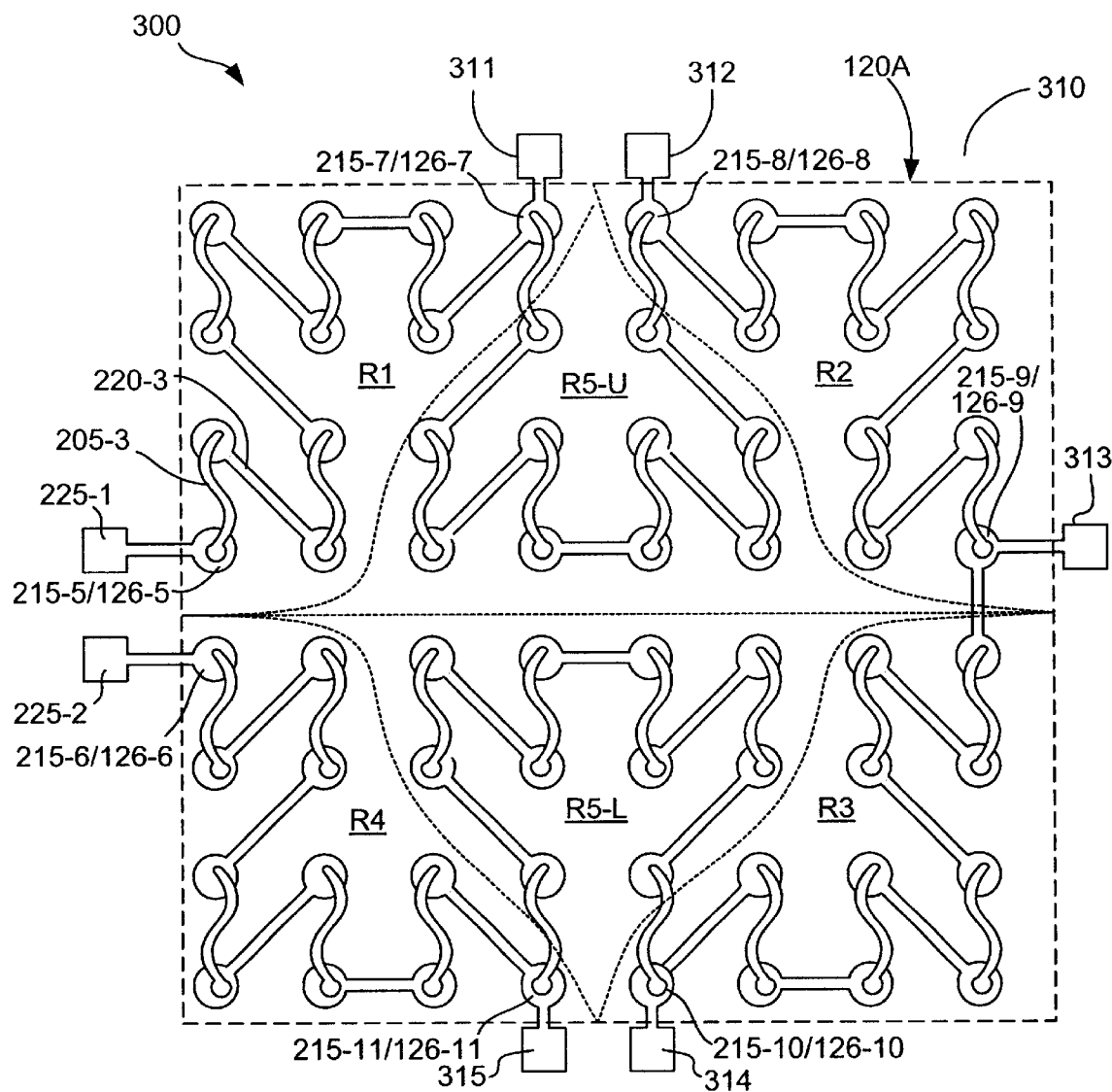
FIG. 7 is a simplified plan view showing an assembly in accordance with another embodiment of the present invention.

FIG. 7 is a simplified plan view showing an assembly 300 in accordance with another embodiment of the present invention. Assembly 300 is essentially identical to assembly 200 in that it includes BGA IC package 120A (described above) and a test PCB 310 that is similar to test PCB 210 (also described above), but includes intermediate test pads 311–315 that are formed on the same surface of test PCB 310 as test pads 225-1 and 225-2. Elements of assembly 300 that correspond to like elements of assembly 200 are identified with the same reference numbers. Elements that are not necessary for describing the differences between assembly 300 and assembly 200 are omitted in the simplified representation shown in FIG. 7 for clarity.

Referring briefly to FIG. 1, BGA package substrate 121 is divided into five regions R1 through R5. As discussed above, BGA packages occasionally warp in response to thermal cycling, and that this tendency to warp is greatest in corner regions R1 through R4, and least in central region R5.

Referring back to FIG. 7, regions R1 through R4 are superimposed on assembly 300, and indicate corner regions of BGA IC package 120A. Note that central region R5 is separated into an upper region R5-U and a lower region R5-L.

In accordance with another aspect of the present invention, the daisy chain structure (conductive path), which is formed as described above, is routed through regions R1, R5-U, R2, R3, R5-L, and R4 of the IC package footprint, respectively, in a serial manner. For example, the first segment of the daisy chain extends from test pad 225-1 to contact pad/solder ball 215-5/126-5, then to bonding wire 205-3, then to conductive line 220-3 in the manner described above until it reaches contact pad/solder ball 215-7/126-7. Note that all of the conductive lines and bonding wires forming the first segment are located in region R1 (i.e., no resources located in regions R2–R4, R5-U and RS-L are utilized in the first segment. A second segment of the daisy chain is located in region R5-U, and extends from contact pad/solder ball 215-7/126-7 to contact pad/solder ball 215-8/126-8. A third segment of the daisy chain is located in region R2, and extends from contact pad/solder ball 215-8/126-8 to contact pad/solder ball 215-9/126-9. A fourth segment of the daisy chain is located in region R3, and extends from contact pad/solder ball 215-9/126-9 to contact pad/solder ball 215-10/126-10. A fifth segment of the daisy chain is located in region R5-L, and extends from contact pad/solder ball 215-10/126-10 to contact pad/solder ball 215-11/126-11. Finally, a sixth segment of the daisy chain is located in region R4, and extends from contact pad/solder ball 215-11/126-11 to contact pad/solder ball 215-6/126-6.

In accordance with yet another aspect of the present invention, intermediate test pads 311–315 are provided on test PCB 310 and connected to intermediate points of the daisy chain to facilitate identifying a region of BGA IC package 120A in which a solder joint fracture occurs during thermal cycling. Specifically, intermediate test pad 311 is connected to contact pad/solder ball 215-7/126-7, intermediate test pad 311 is connected to contact pad/solder ball 215-7/126-7, intermediate test pad 312 is connected to contact pad/solder ball 215-8/126-8, intermediate test pad 313 is connected to contact pad/solder ball 215-9/126-9, intermediate test pad 314 is connected to contact pad/solder ball 215-10/126-10, and intermediate test pad 315 is connected to contact pad/solder ball 215-11/126-11. Intermediate test pads 311-315, along with test pads 225-1 and 225-2, facilitate locating solder joint fractures in corner regions R1 through R4 by allowing manual probing of these regions individually after a solder joint fracture is detected using the method described above. For example, a solder joint fracture located in region R1 is identified by applying a voltage to test pad 225-1 (or intermediate test pad 311) and measuring the resulting current at intermediate test pad 311 (or test pad 225-1). A solder joint fracture located in region R2 is identified by applying a voltage to intermediate test pad 312 (or intermediate test pad 313) and measuring the resulting current at intermediate test pad 313 (or intermediate test pad 312). A solder joint fracture located in region R3 is identified by applying a voltage to intermediate test pad 313 (or intermediate test pad 312) and measuring the resulting current at intermediate test pad 312 (or intermediate test pad 313). Finally, a solder joint fracture located in region R4 is identified by applying a voltage to intermediate test pad 315 (or test pad 225-2) and measuring the resulting current at test pad 225-2 (or intermediate test pad 315).

Occasionally, solder joint fractures occur in central regions of BGA IC package 120A. In these instances, after failing to detect a solder joint fracture in corner regions R1–R4, central regions R5-U and R5-L can be individually probed using intermediate test pads 311, 312, 314, and 315. Specifically, a solder joint fracture located in upper central region R5-U is identified by applying a voltage to intermediate test pad 311 (or intermediate test pad 312) and measuring the resulting current at intermediate test pad 312 (or intermediate test pad 311). Similarly, a solder joint fracture located in lower central region R5-L is identified by applying a voltage to intermediate test pad 314 (or intermediate test pad 315) and measuring the resulting current at intermediate test pad 315 (or intermediate test pad 314).

As described above, assembly 300 facilitates the identification of the specific region in which a solder joint fracture occurs by providing intermediate test pads 311–315. Knowing the region in which solder joint fractures occur allows a IC package manufacturer to detect and correct package design flaws by identifying particular regions of an IC package that are subjected to a high number of solder joint fractures. For example, when an IC package manufacturer determines that a particularly high number of solder joint fractures occur due to warping of corner region R1 of BGA IC package 120A, the IC package manufacturer may redesign BGA IC package 120A to include more flexible materials in corner region R1, thereby reducing the effects of thermal expansion. Accordingly, the provision of intermediate test pads 311–315 greatly facilitates the efficient design and testing of BGA IC packages.

Figure 8:
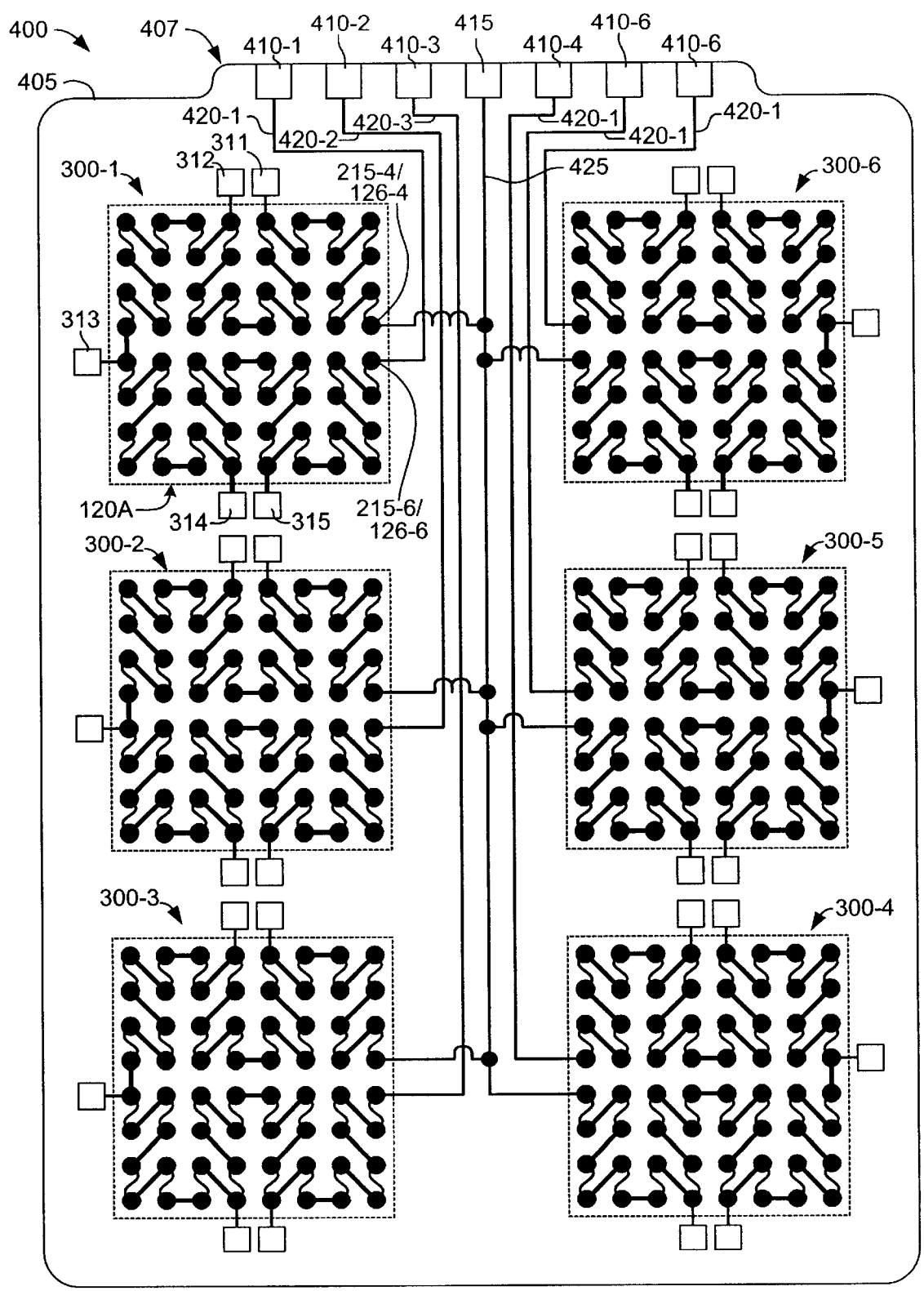
FIG. 8 is a simplified plan view showing an assembly in accordance with another embodiment of the present invention.

FIG. 8 is a simplified plan view showing an assembly 400 in accordance with another embodiment of the present invention. Assembly 400 includes a test PCB 405 having multiple single-package test sites 300-1 through 300-6, each test site being essentially identical to assembly 300, described above with reference to FIG. 7. Specifically, each test assembly site 300-1 through 300-6 includes contact pads for mounting one IC package 120A (described above with reference to FIGS. 4 and 5). Each test site is connected by elongated conductive traces 420-1 through 420-6 and 425 to a test socket 407, which is constructed for reception by a testing device, such as a HP-75000 Series B event detector, produced by Hewlett-Packard of Palo Alto, Calif., or a 32 EHD event detector, produced by Analysis & Technology, Inc. of Wakefield, Mass. For example, contact pad/solder ball 215-4/126-4 of test site 300-1 is connected to contact pad 415 by conductive trace 425, and contact pad/solder ball 215-6/126-6 of test site 300-1 is connected to contact pad 410-1 by conductive trace 420-1. Accordingly, BGA IC package 120A of test site 300-1 is tested using a testing device by transmitting a test voltage onto contact pad 415 and measuring the resulting current at contact pad 410-1. Similarly, solder joint fracture testing is performed at test sites 300-2 through 300-6 by transmitting a test voltage onto contact pad 415 and measuring the resulting currents at contact pads 410-2 through 410-6, thereby allowing simultaneous testing of up to six IC packages using test PCB 400. Accordingly, assembly 400 facilitates the efficient generation of statistical solder joint fracture data for a selected IC package. In addition, intermediate test pads 311–316 are provided on test PCB 400 for each test site 300-1 through 300-6 that facilitate identifying regions in which solder joint fractures occur in each tested package after the multiple package testing is completed, thereby allowing package design defects to be quickly and efficiently identified.

Figure 9:
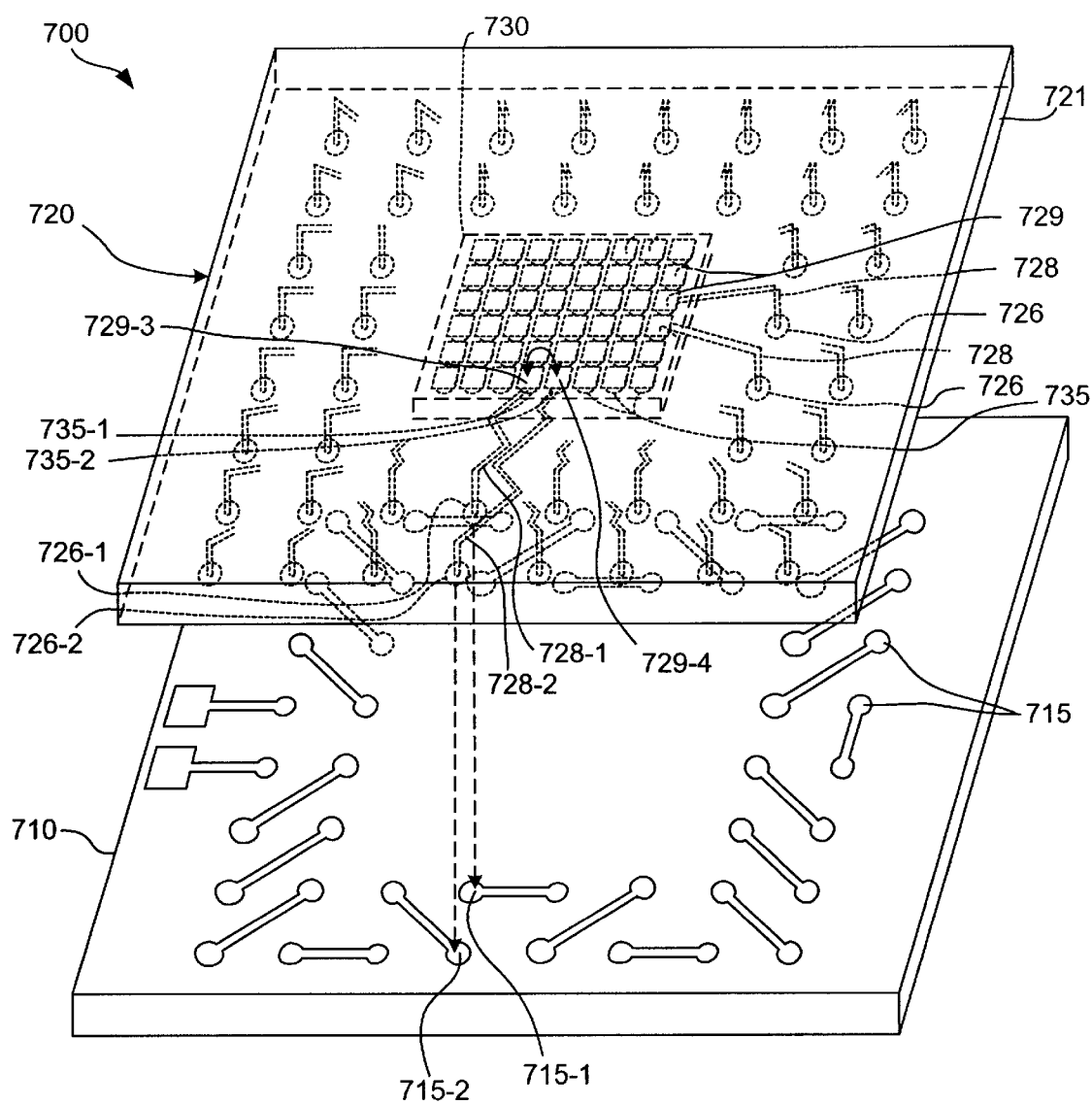
FIG. 9 is a perspective view showing an assembly for testing BGA packages in accordance with a second embodiment of the present invention.
Figure 10:
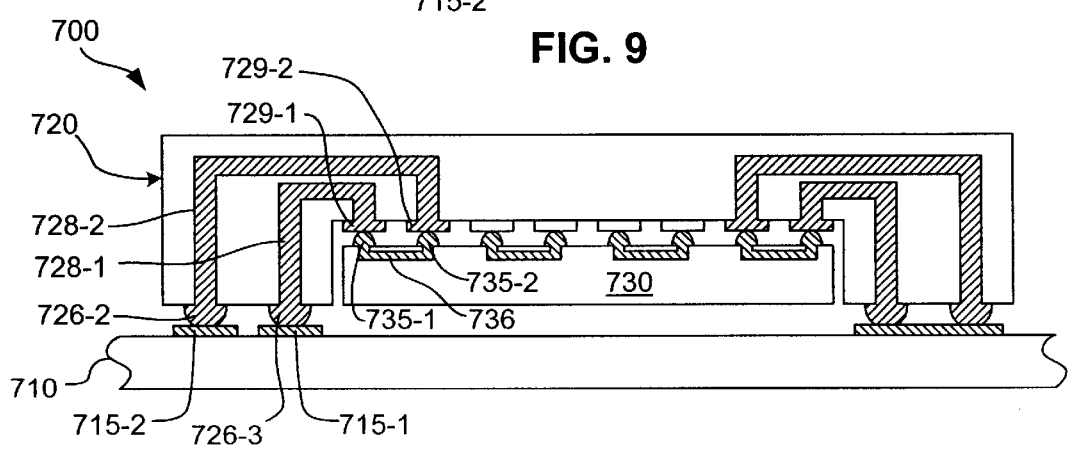
FIG. 10 is a cross-sectional side view showing the assembly of FIG. 9.

FIGS. 9 and 10 are an exploded perspective view and a cross-sectional side view showing a simplified assembly 700 for testing BGA packages in accordance with a second embodiment of the present invention. Assembly 700 includes a test PCB 710, a "flip-chip" BGA package 720 mounted on test PCB 710, and a test IC (substrate) 730 mounted in a central cavity formed in the lower surface of "flip-chip" BGA package 720. Referring to the right side of FIG. 9, contact pads 715 are arranged in a pattern on an upper surface of PCB 710. "Flip-chip" BGA package 720 includes solder balls 726 arranged on a lower surface of a package substrate 721 in a pattern that matches the pattern of contact pads 715. Solder balls 726 are connected by conductive vias/lines 728 to an array of contact pads 729 that are located in the central opening. Note that horizontal portions of conductive vias/lines 728 are omitted in FIG. 9 for clarity. Test IC 730 is a substrate having solder balls 735 formed thereon in a pattern that matches the array of contact pads 729.

Similar to the embodiments described above, selected pairs of contact pads 725 are connected by conductive lines to form a lower daisy chain portion, and selected pairs of solder balls 726 of "flip-chip" BGA package 720 are connected to form an upper daisy chain portion. However, instead of using bonding wire to provide the necessary connections on "flip-chip" BGA package 720, connections are provided by connecting corresponding pairs of solder balls 735 on test IC 730, and then mounting test IC 730 onto contact pads 729. For example, referring to the left side of FIG. 10, contact pad 715-1 of test PCB 710 is connected to solder ball 726-1, which in turn is connected by via/line 728-1 to contact pad 729-1. Similarly, solder ball 726-2 is mounted on contact pad 715-2, and is connected by via/line 728-2 to contact pad 729-2. Test IC 730 is mounted such that solder balls 735-1 and 735-2 are mounted on contact pads 729-1 and 739-2, respectively. To complete the upper portion of the daisy chain, a conductor 736 is formed on test IC 730 that connects solder balls 735-1 and 735-2. This arrangement is repeated for all of the contacts/solder balls connecting "flip-chip" BGA package 720 to test PCB 710 and test IC 730, thereby facilitating the testing procedures described above.

Although the present invention has been described with respect to certain specific embodiments, it will be clear to those skilled in the art that the inventive features of the present invention are applicable to other embodiments as well, all of which are intended to fall within the scope of the present invention. For example, additional intermediate test pads may be provided and the daisy chain structure arranged to facilitate localized analysis of more than five or six regions of an IC package. Further, any number of test sites (e.g., fifteen) may be provided on a test PCB similar to that shown in FIG. 8. Further, the testing methods described herein are not limited to thermal cycling, but may also be used to test for solder joint fractures occurring in response to other external stimulus (for example, vibration, mechanical shock and humidity testing).

What is claimed is:

1. An assembly for analyzing solder joint fractures in response to external stimulus, the assembly comprising:

an integrated circuit (IC) package including a plurality of solder balls and a plurality of conductors connecting associated pairs of the solder balls to form a first daisy chain portion; and a printed circuit board (PCB) having a plurality of contact pads, a first test pad and a second test pad formed thereon, wherein associated pairs of contact pads are connected by conductive structures to form a second daisy chain portion, and wherein the first test pad and second test pad are respectively connected to first and second contact pads of the plurality of contact pads;

wherein the IC package is mounted on the PCB such that each of the plurality of solder balls is soldered to a corresponding contact pad of the plurality of contact pads, and the associated pairs of connected solder balls and the associated pairs of connected contact pads form a conductive path through all of the plurality of solder balls between the first test pad and the second test pad, wherein the solder balls are formed on a first surface of the IC package, and wherein the conductive structures comprise:

a plurality of metal vias passing through the IC package and a plurality of contact pads formed on a second surface of the IC package, each metal via extending from an associated solder ball to an associated contact pad, and a plurality of bonding wires connecting the associated pairs of contact pads.

2. The assembly according to claim 1, wherein the PCB further comprises a first intermediate test pad connected to a third contact pad, the third contact pad being located such that a portion of the conductive path is located in a first region of the IC package between the first test pad and the first intermediate test pad.

3. The assembly according to claim 2, wherein a footprint of the IC package is square, and wherein the first region is located in a corner of the square footprint.

4. The assembly according to claim 2, wherein the PCB further comprises a second intermediate test pad connected to a fourth contact pad, and a third intermediate test pad connected to a fifth contact pad, the fourth and fifth contact pads being located such that a portion of the conductive path is located in a second region between the fourth and fifth intermediate test pads.

5. An assembly for analyzing solder joint fractures in response to external stimulus, the assembly comprising:

an integrated circuit (IC) package including a plurality of solder balls and a plurality of conductors connecting associated pairs of the solder balls to form a first daisy chain portion; and a printed circuit board (PCB) having a plurality of contact pads, a first test pad and a second test pad formed thereon, wherein associated pairs of contact pads are connected by conductive structures to form a second daisy chain portion, and wherein the first test pad and second test pad are respectively connected to first and second contact pads of the plurality of contact pads;

wherein the IC package is mounted on the PCB such that each of the plurality of solder balls is soldered to a corresponding contact pad of the plurality of contact pads, and the associated pairs of connected solder balls and the associated pairs of connected contact pads form a conductive path through all of the plurality of solder balls between the first test pad and the second test pad, wherein the solder balls are formed on a first surface of the IC package, and wherein the conductive structures comprise:
- a plurality of metal vias passing through the IC package and a plurality of contact pads formed in a central cavity defined on the first surface of the IC package, each metal via extending from an associated solder ball to an associated contact pad, and
- a dummy substrate mounted in the central cavity and including a plurality of second solder balls mounted on the contact pads, wherein corresponding pairs of second solder balls are connected by conductors such that the dummy substrate provides electrical connections between the associated pairs of contact pads.

6. A method for testing an integrated circuit (IC) package for solder joint fracture, the IC package having a plurality of solder balls, the method comprising:

daisy chaining each of the plurality of solder balls by connecting associated pairs of solder balls on the IC package, and by mounting the IC package onto a printed circuit board (PCB) having associated pairs of contact pads connected by conductive lines, whereby the associated pairs of connected solder balls and the associated pairs of connected contact pads form a conductive path through all of the plurality of solder balls; and repeatedly subjecting the IC package and PCB to an external stimulus while measuring a current transmitted along the conductive path until an open circuit is detected in the conductive path, wherein daisy chaining the solder balls comprises connecting the associated pairs of solder balls by wire bonding contact pads that are mounted on the IC package and are connected to the solder balls by conductive lines.

7. The method according to claim 6, wherein daisy chaining further comprises forming a first segment of the conductive path in a first region of the IC package, and forming a second segment of the conductive path in a second region of the IC package, and wherein the method further comprises, after repeatedly subjecting the IC package and PCB to an external stimulus until the open circuit is detected, separately probing each of the first and second segments to determine the location of the open circuit.

8. The method according to claim 7, wherein a footprint of the IC package is square, and wherein the first and second regions are located in corners of the square footprint.

9. A method for testing an integrated circuit (IC) package for solder joint fracture, the IC package having a plurality of solder balls, the method comprising:

daisy chaining each of the plurality of solder balls by connecting associated pairs of solder balls on the IC package, and by mounting the IC package onto a printed circuit board (PCB) having associated pairs of contact pads connected by conductive lines, whereby the associated pairs of connected solder balls and the associated pairs of connected contact pads form a conductive path through all of the plurality of solder balls; and repeatedly subjecting the IC package and PCB to an external stimulus while measuring a current transmitted along the conductive path until an open circuit is detected in the conductive path, wherein daisy chaining the solder balls comprises connecting a dummy substrate onto an array of contact pads that are formed on the IC package and,connected to the solder balls by conductive lines, wherein the dummy substrate provides electrical connections between associated pairs of the contact pads.

10. The method according to claim 6, wherein repeatedly subjecting the IC package and PCB to the external stimulus comprises heating and cooling the IC package and PCB.

11. The method according to claim 6, wherein repeatedly subjecting the IC package and PCB to the external stimulus comprises vibrating the IC package and PCB.

12. The method according to claim 6, wherein repeatedly subjecting the IC package and PCB to the external stimulus comprises subjecting the IC package and PCB to external shock.

13. The method according to claim 6, wherein repeatedly subjecting the IC package and PCB to the external stimulus comprises subjecting the IC package and PCB to humidity.

* * * * *